(12) United States Patent
Lauer (10) Patent No.: US 7,580,228 B1
(45) Date of Patent: Aug. 25, 2009

(54) CURRENT PERPENDICULAR TO PLANE SENSOR WITH NON-RECTANGULAR SENSE LAYER STACK

(76) Inventor: Mark A. Lauer, 3618 Trenery Dr., Pleasanton, CA (US) 94588

(*) Notice: Subject to any disclaimer, the term of this patent is extended or adjusted under 35 U.S.C. 154(b) by 621 days.

(21) Appl. No.: 11/142,170

(22) Filed: May 31, 2005

Related U.S. Application Data

(60) Provisional application No. 60/575,480, filed on May 29, 2004.

(51) Int. Cl.
G11B 5/39 (2006.01)
G11B 5/127 (2006.01)

(52) U.S. Cl. ............... 360/324.12; 360/324.2; 324/207.21

(58) Field of Classification Search ....... 360/324.2, 360/324.12; 338/32 R; 324/207.21
See application file for complete search history.

(56) References Cited

U.S. PATENT DOCUMENTS

| | | | | |
|---|---|---|---|---|
| 3,448,438 A * | 6/1969 | May et al. | ............... | 365/171 |
| 5,483,403 A * | 1/1996 | Voegeli | ............... | 360/321 |
| 5,682,284 A * | 10/1997 | George | ............... | 360/322 |
| 5,703,738 A * | 12/1997 | Kim et al. | ............... | 360/327 |
| 5,737,155 A * | 4/1998 | George et al. | ............... | 360/327.31 |
| 5,757,695 A * | 5/1998 | Shi et al. | ............... | 365/158 |
| 5,923,583 A * | 7/1999 | Womack | ............... | 365/171 |
| 6,097,579 A * | 8/2000 | Gill | ............... | 360/324.2 |
| 6,104,633 A * | 8/2000 | Abraham et al. | ............... | 365/171 |
| 6,205,053 B1 * | 3/2001 | Anthony | ............... | 365/173 |
| 6,391,483 B1 * | 5/2002 | Zhu et al. | ............... | 428/810 |
| 6,579,625 B1 * | 6/2003 | Engel et al. | ............... | 428/611 |
| 6,605,836 B2 * | 8/2003 | Kishi et al. | ............... | 257/295 |
| 6,621,659 B1 * | 9/2003 | Shukh et al. | ............... | 360/125.43 |
| 6,906,369 B2 * | 6/2005 | Ross et al. | ............... | 257/295 |
| 6,943,040 B2 * | 9/2005 | Min et al. | ............... | 438/3 |
| 6,949,779 B2 * | 9/2005 | Kai et al. | ............... | 227/295 |
| 6,956,257 B2 * | 10/2005 | Zhu et al. | ............... | 257/295 |
| 7,002,839 B2 * | 2/2006 | Kawabata et al. | ............... | 365/171 |
| 7,093,347 B2 * | 8/2006 | Nowak et al. | ............... | 29/603.07 |
| 7,099,185 B2 * | 8/2006 | Yamamoto et al. | ............... | 365/158 |
| 7,170,775 B2 * | 1/2007 | Lin et al. | ............... | 365/158 |
| 7,291,892 B2 * | 11/2007 | Min et al. | ............... | 257/421 |
| 2002/0130339 A1 * | 9/2002 | Kishi et al. | ............... | 257/295 |
| 2002/0154456 A1 * | 10/2002 | Carey et al. | ............... | 360/324.11 |
| 2004/0150922 A1 * | 8/2004 | Kagami et al. | ............... | 360/324.2 |
| 2006/0267056 A1 * | 11/2006 | Ju et al. | ............... | 257/295 |
| 2007/0019337 A1 * | 1/2007 | Apalkov et al. | ............... | 360/324.1 |
| 2007/0278529 A1 * | 12/2007 | Lai et al. | ............... | 257/209 |

* cited by examiner

Primary Examiner—Brian E Miller (57) ABSTRACT

A CPP MR sensor includes a sense layer with a smoothly curving perimeter, lowering edge effects and Barkhausen noise. For example, a circular or oval CPP sensor stack can be defined, or the sensor layers can be milled to have a tapered track width that is narrower adjacent media facing surface, to avoid sharp corners at that media facing surface after lapping which has been monitored for resistance change to terminate at the correct plane. Single domain sensor layers, such as free, pinned, and bias layers, can be produced with this technique, increasing stability, lowering noise and increasing magnetoresistance of the sensor. A smoother rotation of the free layer magnetic moment, and a more linear signal, can also be provided. An antiferromagnetic bias layer can also be eliminated due to the reduced edge effects of the free layer.

21 Claims, 6 Drawing Sheets

CURRENT PERPENDICULAR TO PLANE SENSOR WITH NON-RECTANGULAR SENSE LAYER STACK

CROSS-REFERENCE TO RELATED APPLICATIONS

This application claims the benefit under 35 U.S.C. §119 (e) of provisional application Ser. No. 60/575,480, filed by the same inventor on May 29, 2004, which is incorporated by reference herein.

TECHNICAL FIELD

This application relates in particular to magnetic sensors for magnetic heads in disk drives, and more generally to electromagnetic sensors for information storage systems, other storage applications, or magnetic field detection, measurement or testing.

DESCRIPTION

A current-perpendicular-to-plane (CPP) magnetoresistive (MR) sensor, in contrast to current-in-plane (CIP) MR sensor, does not have leads connected to the sensor in a track-width direction. A CPP sensor is disclosed that has a stripe height that may be defined along with its track width. Such a CPP sensor may be defined with a smooth curve connecting its track width and stripe height, lowering edge effects and Barkhausen noise in the sensor. For example, a stack of sensing layers can be ion milled to have a somewhat rectangular shape but with rounded corners that reduce edge effects, the rounded corners causing the perimeter of each layer to be non-rectangular. Alternatively, a circular or oval CPP sensor stack can be defined during milling. In both these approaches, sharp corners may still exist at track-width edges of the stack adjacent to a medium-facing surface, after the stack has been cut along a medium-facing surface into two sensors.

In one embodiment, a magnetic sensor is disclosed that carries electrical current between first and second soft magnetic shields, the sensor comprising: the first and second soft magnetic shields; a ferromagnetic pinned layer that is disposed between the shields and that has a magnetization that is stable in response to an applied magnetic field; a soft magnetic free layer that is disposed between the shields and that has a magnetization that changes in response to the applied magnetic field; and a nonferromagnetic spacer layer that separates the pinned layer from the free layer; wherein the free layer has a non-rectangular perimeter, and the second shield encircles a first portion of the perimeter but does not encircle a second portion of the perimeter that is adjacent to a media-facing surface, such that the second portion of the perimeter is exposed to the applied magnetic field via the media-facing surface.

In one embodiment, a current-perpendicular-to-plane (CPP) sensor is disclosed, the sensor comprising: a first soft magnetic shield; a second soft magnetic shield; a ferromagnetic pinned layer that is disposed between the first and second shields, the pinned layer having a magnetization that is stable in response to an applied magnetic field; a soft magnetic free layer that is disposed between the first and second shields, the free layer having a magnetization that changes in response to the applied magnetic field; and a nonferromagnetic spacer layer that separates the pinned layer from the free layer; wherein at least one of the pinned, free and spacer layers has a non-rectangular perimeter and the second shield encircles a first portion of the perimeter but does not encircle a second portion of the perimeter that is adjacent to a media-facing surface, such that the second portion of the perimeter is exposed to the applied magnetic field via the media-facing surface.

In one embodiment, a method for detecting a magnetic signal is disclosed, the method comprising the steps of: positioning a ferromagnetic free layer and a ferromagnetic pinned layer adjacent to the magnetic signal and between first and second soft magnetic shields; flowing an electrical current from one of the shields to the other, including passing the current through a stack of layers including the free and pinned layers; and impinging the magnetic signal on the free layer, including changing the magnetic moment of the free layer and changing the resistance of the stack of layers; and reducing edge effects in the free layer by having a smoothly curved perimeter for the free layer, including reducing Barhausen noise generated by the free layer; and encircling a majority of the perimeter with one of the first and second soft magnetic shields, thereby focusing the detection of the magnetic signal on a minority of the perimeter of the free layer that is not encircled by the one of the first and second shields.

Alternatively, a stack of CPP sensor layers can be milled to have a tapered track width that is narrower adjacent to a plane that is designed to be the media facing surface, to avoid sharp corners at that media facing surface after lapping which has been monitored for resistance change to terminate at the correct plane. Similarly, pairs of oval sensor stacks can be formed by milling, with lapping performed along cut lines after the sensors have been cut apart, the lapping monitored for resistance change or chemical species to determine the point of termination. Single domain sensor layers, such as free, pinned, and bias layers, can be produced with this technique, increasing stability, lowering noise and increasing magnetoresistance of the sensor. A smoother rotation of the free layer magnetic moment, and a more linear signal, can also be provided.

Figure 1:
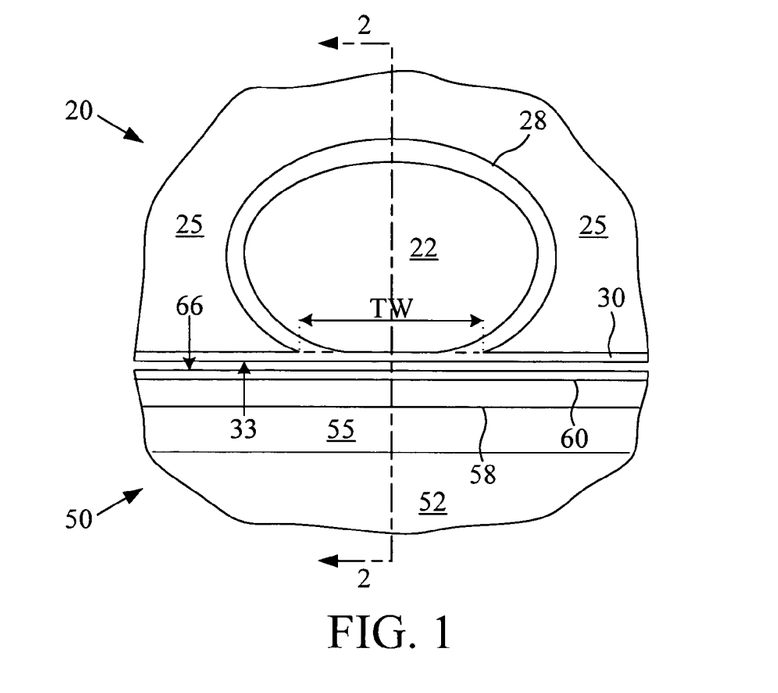

FIG. 1 is a cutaway cross-sectional view of a MR sensor 20 that is disposed adjacent to a medium 50 such as a disk or tape. Although an information storage system such as a disk drive is depicted, the sensor 20 can alternatively be used for detection, measurement or testing of magnetic fields. The sensor 20 includes a substantially oval-shaped, soft magnetic free layer 22 that is separated from a soft magnetic shield 25 by an electrically insulating layer 28. The free layer 22 and shield 25 may be formed, for example, of permalloy or other known free layer materials and the insulating layer 28 may be formed, for example, of alumina or silicon dioxide. The sensor 20 is constructed so that electrical current traverses the free layer 22 in a direction generally perpendicular to that layer, e.g., into or out of the page of FIG. 1. A hard protective coating 30 has been formed on the layers 22, 25 and 28, for example of diamond-like carbon (DLC), tetrahedral-amorphous carbon (ta-C) or the like, creating a medium-facing surface 33. The free layer 22 has a track-width (TW) that is exposed to the medium 50 through the shield 25. The overall width of the free layer in the track-width direction may be in a range between about one-quarter micron and twenty nanometers, and the track-width (TW) separation of the shield 25 adjacent to the medium-facing surface 33 may be about one-quarter to one-half the overall width.

The medium 50 includes a substrate 52, an underlayer 55, a media layer 58 and a protective overcoat 60 that forms a medium surface 66. The underlayer 55 may be made of soft magnetic material, for the situation in which the medium layer has an easy axis of magnetization substantially perpendicular to the medium surface 66, and the media layer 58, as well as other medium layers, may be formed of plural lamina.

Figure 2:
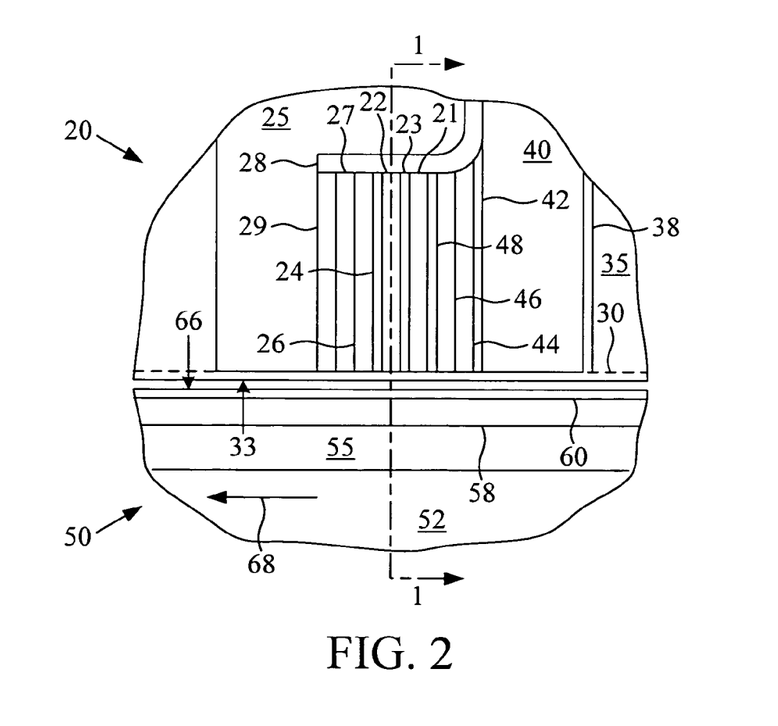

The medium 50 is traveling relative to the sensor 20, or the sensor is traveling relative to the medium, as indicated by arrow 68 in FIG. 2. FIG. 2 also shows the layers of the sensor 20 that were fabricated on a wafer substrate 35, after which the substrate and thin film layers were cut and polished along the medium-facing surface 33.

On the substrate 35, which may be made of alumina, silicon, alumina-titanium-carbide, or other known materials, an underlayer 38 for example of polished alumina has been formed, on top of which a first soft magnetic shield 40 has been formed, for instance of permalloy. The first shield 40 also serves as an electrical lead for the sensor 20.

An electrically conductive seed or template layer 42 has been formed on the first shield, 40, the seed layer promoting favorable growth of an electrically conductive antiferromagnetic (AF) layer 44, which may be made of, for example, an alloy containing manganese, such as platinum-manganese (PtMn). A first ferromagnetic layer 46 has its magnetic moment pinned by the AF layer 44 in a direction substantially perpendicular to the medium-facing surface 33. An electrically conductive, nonmagnetic layer 48 has been formed to a thickness of about one nanometer or less, for example of ruthenium (Ru) or metals known to provide antiparallel exchange coupling, to couple the first ferromagnetic pinned layer 21 to the first ferromagnetic layer 46, so that the magnetic moments of layers 21 and 46 are oppositely directed. Due to the favorable geometry of the layers 21 and 46, the AF layer 44 may not need to provide as strong a pinning field, affording options for reducing the underlying resistance of the sensor, so that a change in resistance of the sensor due to an applied magnetic field is more pronounced. Alternatively, layers 46 and 48 may also not be needed due to the favorable geometry of layer 21, also lowering the underlying sensor resistance.

A nonferromagnetic spacer layer 23 separates the pinned layer 21 from the soft magnetic free layer 22. The spacer layer 23 may be dielectric or electrically conductive, or may have portions that are conductive and other portions that are insulating or resistive. An electrically conductive, nonmagnetic coupling layer 24 magnetostatically couples the free layer 22 to a hard magnetic bias layer 26. The hard bias layer 26 has its magnetization pinned by an AF layer 27 in a direction substantially parallel to the medium-facing surface 33, so that opposite ends of free layer 22 are stabilized by the bias layer 26 in the track-width direction. Due to the favorable geometry of the layers 22 and 26, the AF layer 27 may not be needed, reducing the underlying resistance of the sensor, so that a change in resistance of the sensor due to an applied magnetic field is more pronounced. In addition to lowering the resistance of the sensor, eliminating the need for a second AF layer solves some manufacturing difficulties that are otherwise present in attempting to fabricate a second AF layer for a sensor stack that already contains a first AF layer.

Figure 3:
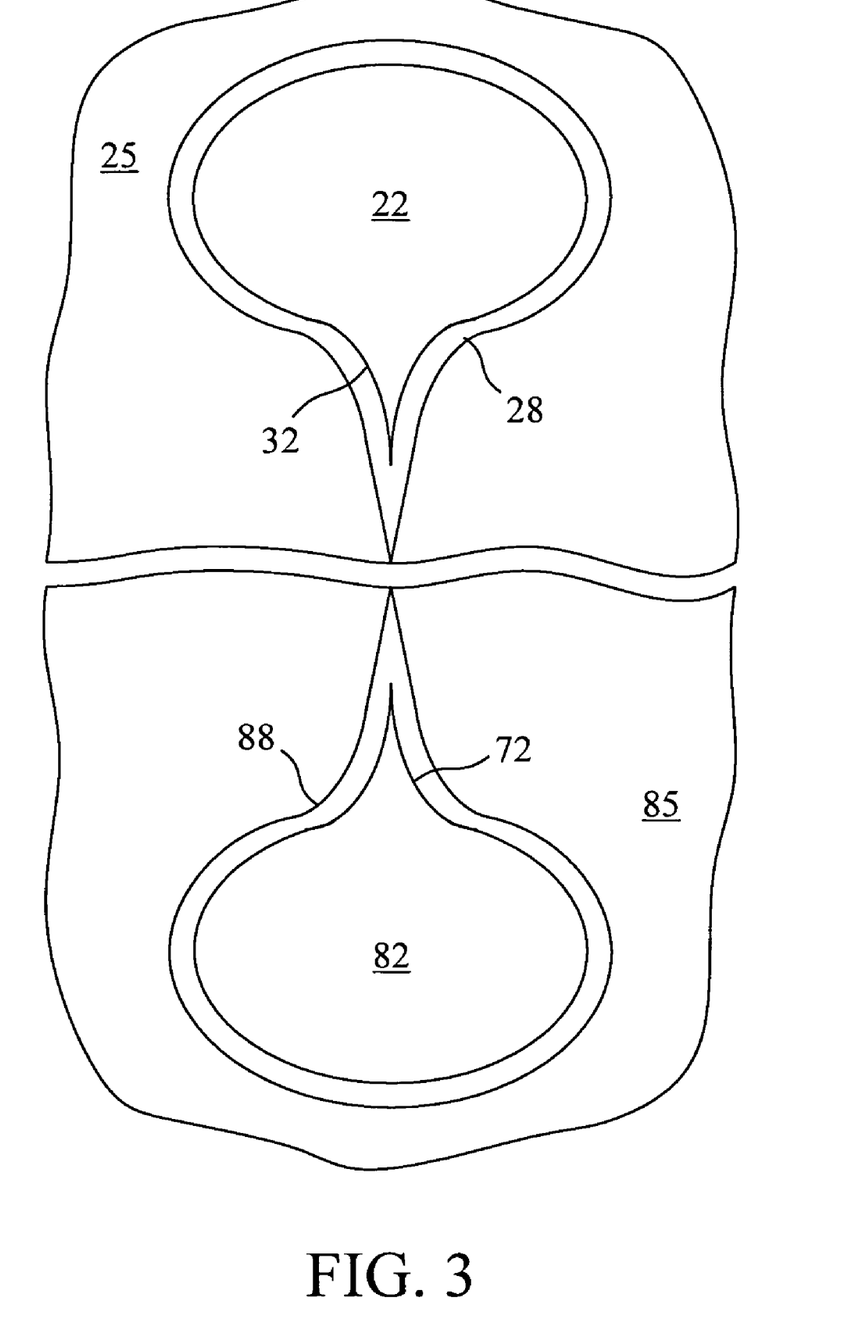

An electrically conductive, protective cap layer 29 has been formed for example of tantalum (Ta) over AF layer 27, after which a mask with a shape that is similar to the combination of layers 22 and 28 in FIG. 3 was formed on the cap layer. A highly anisotropic etch such as an ion beam etch (IBE) was then performed to remove layers not covered by the mask, leaving a stack of layers, each of which looks like layer 22 in FIG. 3, disposed atop the first shield 40. With the mask still covering the top of those layers, a layer of electrically insulating material 28 such as alumina or silicon dioxide was formed, for example by sputtering, on the sides of those layers and atop the exposed portion of the first shield 40. After removal of the mask and any of the insulating material disposed atop the mask, a second soft magnetic shield 25 was formed adjoining cap layer 29 and insulating layer 28.

FIG. 3 is a cutaway cross-sectional view of a step in the fabrication of sensor 20. A mirror image free layer 82, insulating layer 88 and shield 85 are evident in this wafer-level diagram. Free layer 22 has a lapping tab 32, and free layer 82 has a lapping tab 72. After formation of layers 22, 28 and 25 as described above, and mirror image layers 82 88 and 85, the wafer is cut along a line between the free layers 22 and 82. The cut surface is polished or lapped while a current is applied between shields 25 and 40, while the resistance to that current is monitored. When the resistance or voltage increases, which indicates that tab 32 has been removed to leave a substantially oval free layer, lapping is terminated. The protective coating 30 may then be applied, the medium-facing surface tailored, and the sensor 20 separated from any other sensors that may be attached in a row.

Although only free 22 is shown in FIG. 1, other sensor layers, such as bias layer 26 and pinned layer 21 may have a similar, substantially oval shape. In the presence of an applied magnetic field, for example from the medium 50, the magnetic moment of the free layer 22 can rotate, while the moment of the pinned layer 21 is stable. Electrons pass more freely between the free layer 22 and the pinned layer 21 when the magnetic moments of those layers are parallel as opposed to anti-parallel, and this change in resistance can be measured as a voltage or current that senses the applied magnetic field.

The substantially oval shape of the free layer 22 makes that layer more stable so that the free layer may have a single magnetic domain even in the absence of bias layer 26 and coupling layer 24. In this regard, all of the ferromagnetic layers having a substantially oval shape may be more stable. In one embodiment, a bias layer structure is not included, and the substantially oval free layer has a single domain with a magnetic moment that was set in an elongated (track-width) direction of the free layer during formation of the free layer.

Figure 4:
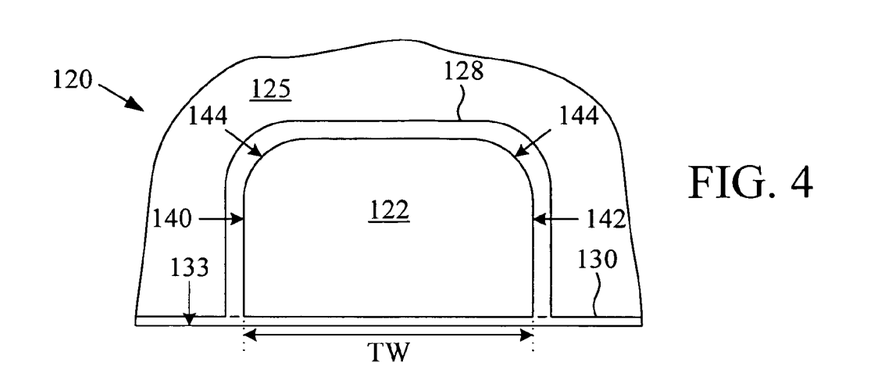

FIG. 4 shows a sensor 120 embodiment that has a soft magnetic free layer 122 that is elongated in the track-width direction between sides 140 and 142. An electrically insulating layer 128 separates the free layer 122 from a soft magnetic shield 125. The free layer 122 has a track-width (TW) that is equal to the distance between the corners closest to the medium-facing surface 133. Free layer 122 has smoothly rounded corners 144 distal to a medium-facing surface 133 and sharp corners adjacent to the medium-facing surface and adjoining protective layer 130. The sensor 120 may have a stack of sensor layers similar to those shown in FIG. 2.

Figure 5:
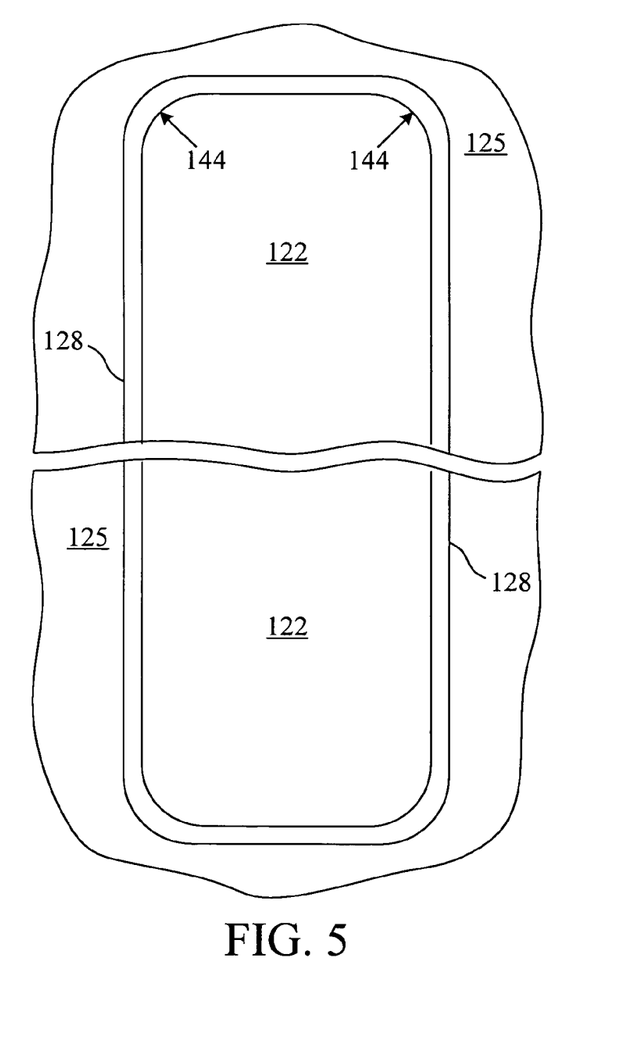

FIG. 5 is a cutaway cross-sectional view of a step in the fabrication of sensor 120. In this step, free layer 122 may be formed as a single layer that has smoothly rounded corners. After formation of the sensor layers, insulating layer 128 and shield 125, the wafer may be cut along a line midway between the free layer 122. The cut surface is polished or lapped while a current is applied between the shields, while the resistance to that current is monitored. When the resistance or voltage increases by a desired amount, which indicates that enough of sensor 120 has been removed to leave a substantially rectangular free layer 122 with rounded corners 144, lapping is terminated. The protective coating 130 may then be applied, the medium-facing surface tailored, and the sensor 120 separated from any other sensors that may be attached in a row.

Figure 6:
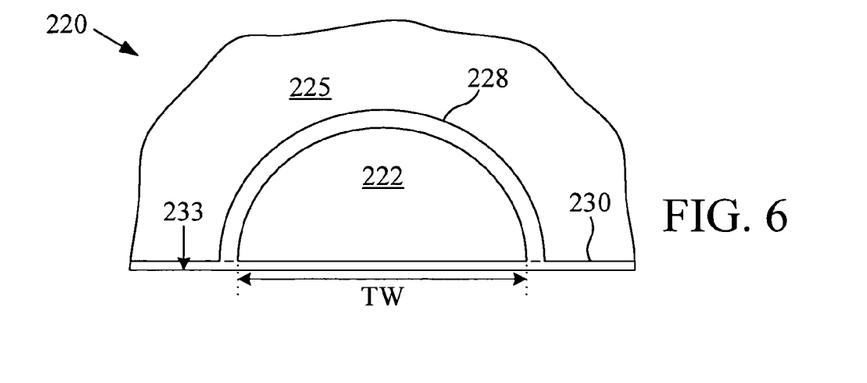

FIG. 6 shows a sensor 220 embodiment that has a soft magnetic free layer 222 that is elongated in the track-width direction and has a substantially semicircular shape. An electrically insulating layer 228 separates the free layer 222 from a soft magnetic shield 225. The free layer 222 has a track-width (TW) that is equal to the distance between the free layer corners closest to the medium-facing surface 233. The sensor 220 may include a stack of sensor layers similar to those shown in FIG. 2, but with the layers of sensor 220 having a substantially semicircular shape.

Figure 7:
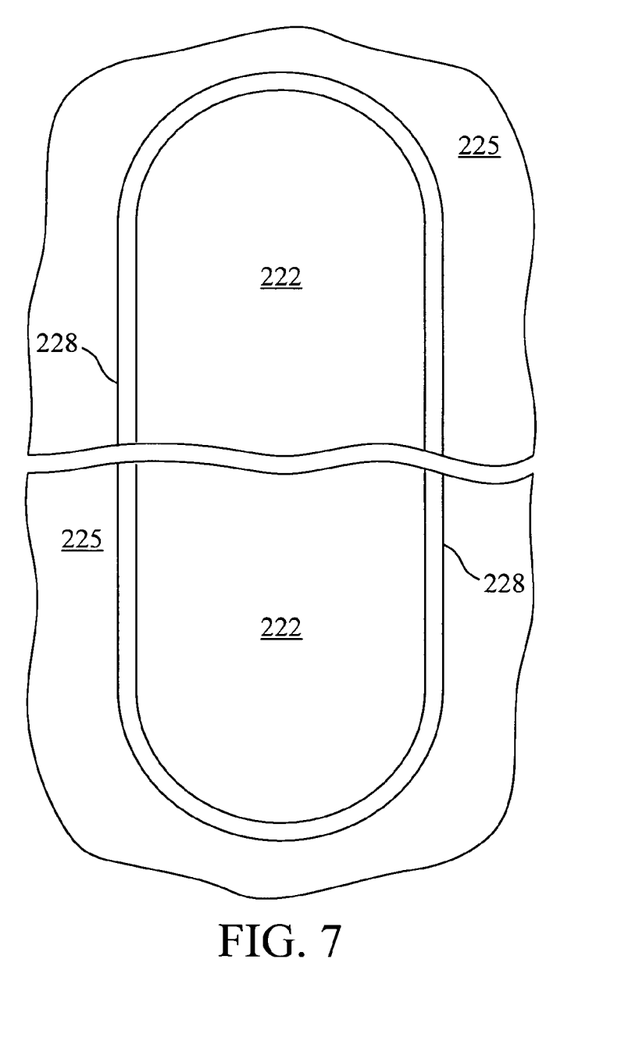

FIG. 7 is a cutaway cross-sectional view of a step in the fabrication of sensor 220. In this step, free layer 222 may be formed as a single layer that has smoothly rounded corners. After formation of the sensor layers, insulating layer 228 and shield 225, the wafer may be cut along a line midway between the free layer 222. The cut surface is polished or lapped while a current is applied between the shields, while the resistance to that current is monitored. When the resistance or voltage increases by a desired amount, which indicates that enough of sensor 220 has been removed to leave a substantially semicircular free layer 222, lapping is terminated. The protective coating 230 may then be applied, the medium-facing surface tailored, and the sensor 220 separated from any other sensors that may be attached in a row.

Figure 8:
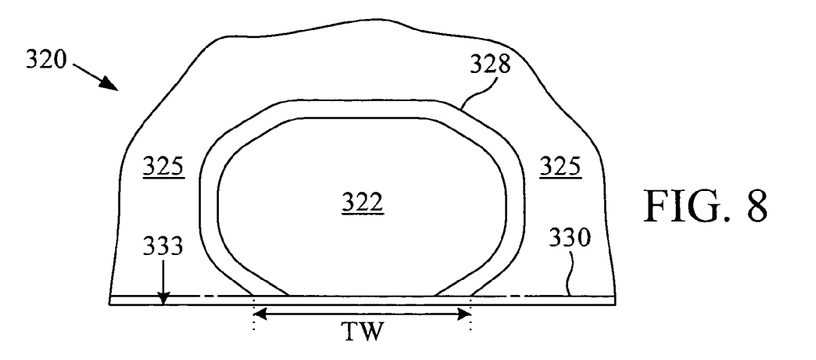

FIG. 8 shows a sensor 320 embodiment that has a soft magnetic free layer 322 that is elongated in the track-width direction to terminate in that direction with rounded edges, the free layer 322 having a flat edge on sides both closest to and furthest from the medium-facing surface 333. An electrically insulating layer 328 separates the free layer 222 from a soft magnetic shield 325. The free layer 322 has an effective track-width (TW) that is less than the extension of the free layer in the track-width direction. The sensor 320 may include a stack of sensor layers similar to those shown in FIG. 2, but with the layers of sensor 320 having a shape that is substantially similar to free layer 322.

Figure 9:
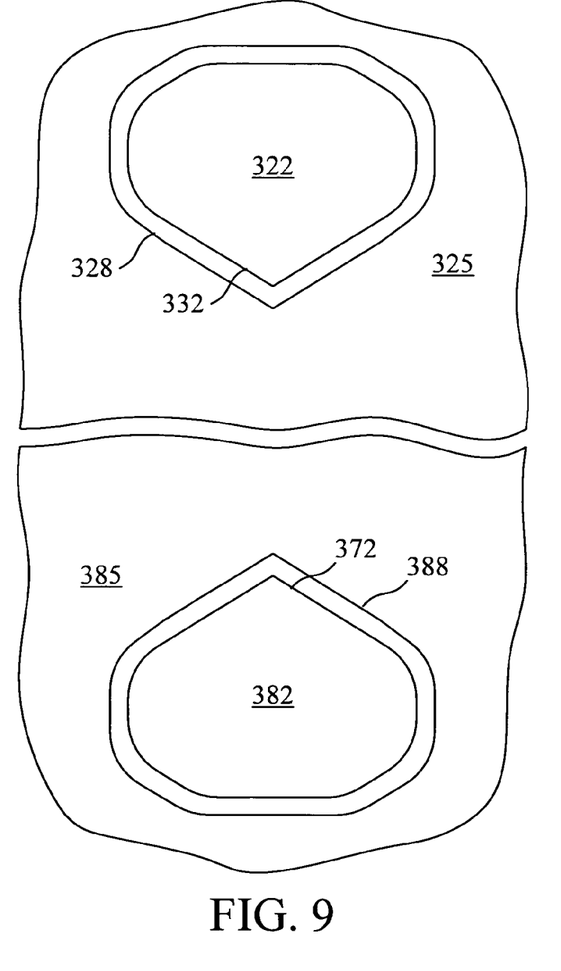

FIG. 9 is a cutaway cross-sectional view of a step in the fabrication of sensor 320. A mirror image free layer 382, insulating layer 388 and shield 385 are evident in this wafer-level diagram. Free layer 322 has a lapping tab 332, and free layer 382 has a lapping tab 372. After formation of layers 322, 328 and 325 as described above, and mirror image layers 382 388 and 85, the wafer is cut along a line between the free layers 322 and 382. The cut surface is polished or lapped while a current is applied between the shields, while the resistance to that current is monitored. When the resistance or voltage increases, which indicates that tab 332 has been removed to leave a substantially oval free layer, lapping is terminated. The protective coating 330 may then be applied, the medium-facing surface 333 tailored, and the sensor 320 separated from any other sensors that may be attached in a row.

Figure 10:
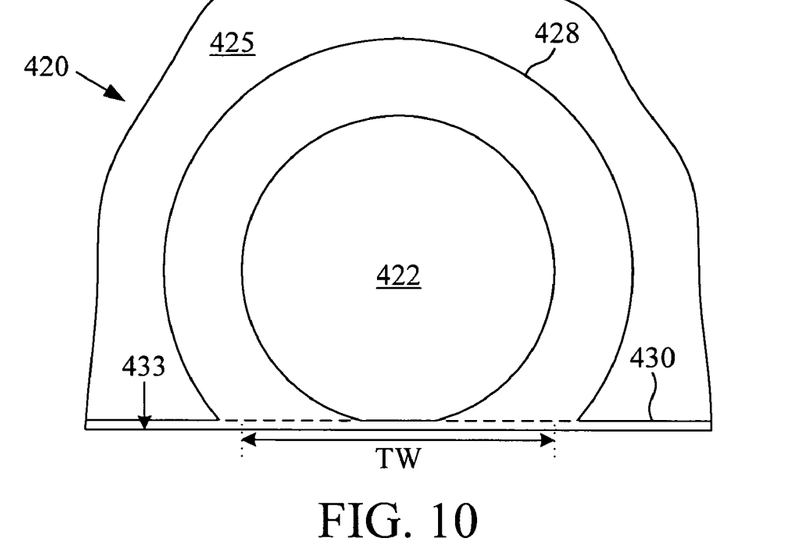

FIG. 10 shows a sensor 420 embodiment that has a soft magnetic free layer 422 that has a substantially circular shape. An electrically insulating layer 428 separates the free layer 422 from a soft magnetic shield 425. The electrically insulating layer 428 of this embodiment is thicker than that shown in other embodiments, but the other embodiments may alternatively have a thicker insulating layer, or this embodiment may have a thinner insulating layer. The free layer 422 has a track-width (TW) that can be considered to be equal to the extension of the free layer in the track-width direction. The sensor 420 may include a stack of sensor layers similar to those shown in FIG. 2, but with the layers of sensor 420 having a substantially circular shape. The sensor 420 may be formed in a manner similar to that described for sensor 22.

Figure 11:
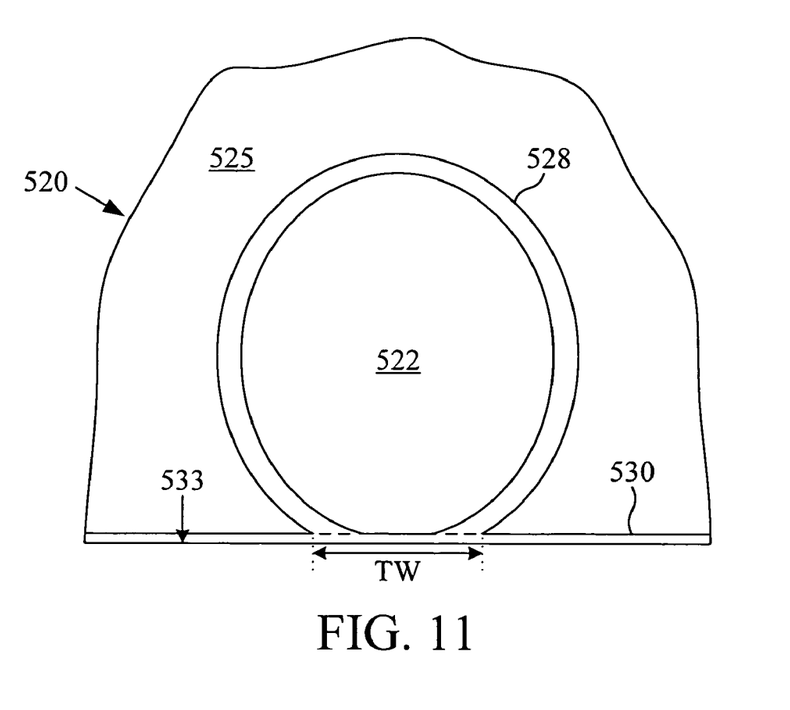

FIG. 11 shows a sensor 520 embodiment that has a soft magnetic free layer 522 that has a substantially oval shape that is elongated in a stripe-height direction that extends away from the medium-facing surface 533. An electrically insulating layer 528 separates the free layer 522 from a soft magnetic shield 525. The free layer 222 has a track-width (TW) that can be considered to be equal to the extension of the free layer in the track-width direction. The sensor 520 may include a stack of sensor layers similar to those shown in FIG. 2, but with the layers of sensor 520 having a substantially oval shape. The sensor 520 may be formed in a manner similar to that described for sensor 22.

Although the embodiments disclosed are not limited by particular dimensions, free layers 22, 122, 222, 322, 422 and 522 may each have a thickness in a range between about one nanometer and one hundred nanometers. Each of the free layers 22, 122, 222, 322, 422 and 522 has a corner or edge with a radius of curvature that is a substantial fraction of the longest dimension of that layer. For example, the free layer 122 shown in FIG. 4 has corners 144 with a radius of curvature that are each about twenty percent of the longest dimension of that layer. As another example, free layer 222 shown in FIG. 6 has an edge with a radius of curvature that is about half the longest dimension of that layer. And free layer 422 shown in FIG. 10 has an edge with a radius of curvature that is nearly one hundred percent of the longest dimension of that layer. Although any increase in such a free layer radius of curvature over that which is conventional may be helpful in reducing edge effects, such a radius of curvature that is greater than about ten percent of the greatest dimension of the layer may be particularly beneficial. Alternatively, such a radius of curvature that is greater than about five or ten nanometers may reduce noise and edge effects, with a radius of curvature that is greater than about twenty or fifty nanometers having a greater effect for larger sensors.

Moreover, although a particular sensor stack has been shown, other configurations of sensor layers, including dual stripe sensors can be formed according to these teachings. Due to the minute dimensions of the sensor layers, the disclosed embodiments may be found by slicing the layers along a cross-section that is parallel to the layers, to see whether the cross-section has a non-rectangular shape, or polishing the layers to expose the shape.

The invention claimed is:

1. A magnetic sensor that carries electrical current between first and second soft magnetic shields, the sensor comprising:
   the first and second soft magnetic shields;
   a ferromagnetic pinned layer that is disposed between the shields and that has a magnetization that is stable in response to an applied magnetic field;
   a soft magnetic free layer that is disposed between the shields and that has a magnetization that changes in response to the applied magnetic field; and
   a nonferromagnetic spacer layer that separates the pinned layer from the free layer;
   wherein the free layer has a non-rectangular perimeter, and the second shield encircles a first portion of the perimeter but does not encircle a second portion of the perimeter that is adjacent to a media-facing surface, such that the second portion of the perimeter is exposed to the applied magnetic field via the media-facing surface.

2. The sensor of claim 1, wherein the perimeter is substantially oval.

3. The sensor of claim 1, wherein the perimeter is substantially circular.

4. The sensor of claim 1, wherein the perimeter is substantially semicircular.

5. The sensor of claim 1, wherein the perimeter has sharp corners adjacent to a medium-facing surface and rounded corners distal to the medium-facing surface.

6. The sensor of claim 1, wherein the free layer extends further in a direction perpendicular to the media-facing surface than in a direction parallel to the media-facing surface.

7. The sensor of claim 1, wherein the free layer magnetization is substantially parallel to the media-facing surface in the absence of the applied magnetic field, and no ferromagnetic or antiferromagrietic material is disposed between the free layer and the second shield.

8. The sensor of claim 1, wherein the perimeter has a portion with a radius of curvature that is greater than twenty nanometers.

9. A current-perpendicular-to-plane (CPP) sensor, the sensor comprising:
   a first soft magnetic shield;
   a second soft magnetic shield;
   a ferromagnetic pinned layer that is disposed between the first and second shields, the pinned layer having a magnetization that is stable in response to an applied magnetic field;
   a soft magnetic free layer that is disposed between the first and second shields, the free layer having a magnetization that changes in response to the applied magnetic field; and
   a nonferromagnetic spacer layer that separates the pinned layer from the free layer;
   wherein at least one of the pinned, free and spacer layers has a non-rectangular perimeter and the second shield encircles a first portion of the perimeter but does not encircle a second portion of the perimeter that is adjacent to a media-facing surface, such that the second portion of the perimeter is exposed to the applied magnetic field via the media-facing surface.

10. The sensor of claim 9, wherein the perimeter is substantially oval.

11. The sensor of claim 9, wherein the perimeter is substantially circular.

12. The sensor of claim 9, wherein the perimeter is substantially semicircular.

13. The sensor of claim 9, wherein the perimeter has sharp corners adjacent to a medium-facing surface and rounded corners distal to the medium-facing surface.

14. The sensor of claim 9, wherein the perimeter has a portion with a radius of curvature that is greater than ten percent of the longest distance between two points of the perimeter.

15. The sensor of claim 9, wherein the perimeter has a portion with a radius of curvature that is greater than twenty nanometers.

16. The sensor of claim 9, wherein the free layer extends further in a direction perpendicular to the media-facing surface than in a direction parallel to the media-facing surface.

17. The sensor of claim 9, wherein the free layer magnetization is substantially parallel to the media-facing surface in the absence of the applied magnetic field, and no ferromagnetic or antiferromagnetic material is disposed between the free layer and the second shield.

18. The sensor of claim 1, wherein the perimeter has a portion with a radius of curvature that is greater than ten percent of the longest distance between two points of the perimeter.

19. A method for detecting a magnetic signal, the method comprising the steps of:
   positioning a ferromagnetic free layer and a ferromagnetic pinned layer adjacent to the magnetic signal and between first and second soft magnetic shields;
   flowing an electrical current from one of the shields to the other, including passing the current through a stack of layers including the free and pinned layers; and
   impinging the magnetic signal on the free layer, including changing the magnetic moment of the free layer and changing the resistance of the stack of layers; and
   reducing edge effects in the free layer by having a smoothly curved perimeter for the free layer, including reducing Barhausen noise generated by the free layer; and
   encircling a majority of the perimeter with one of the first and second soft magnetic shields, thereby focusing the detection of the magnetic signal on a minority of the perimeter of the free layer that is not encircled by the one of the first and second shields.

20. The method of claim 19, wherein reducing edge effects in the free layer includes using a substantially oval free layer.

21. The method of claim 19, wherein reducing edge effects in the free layer includes using a substantially circular free layer.

* * * * *

UNITED STATES PATENT AND TRADEMARK OFFICE
CERTIFICATE OF CORRECTION

PATENT NO. : 7,580,228 B1 Page 1 of 1
APPLICATION NO. : 11/142170
DATED : August 25, 2009
INVENTOR(S) : Mark A. Lauer It is certified that error appears in the above-identified patent and that said Letters Patent is hereby corrected as shown below:

In column 7, line 4, change "antiferromagrietic" to "antiferromagnetic".

Signed and Sealed this

Thirtieth Day of March, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,580,228 B1 | Page 1 of 1 |
| APPLICATION NO. | : 11/142170 | |
| DATED | : August 25, 2009 | |
| INVENTOR(S) | : Mark A. Lauer | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1070 days.

Signed and Sealed this

Fourteenth Day of September, 2010

David J. Kappos
*Director of the United States Patent and Trademark Office*